(12) United States Patent
Holzmann et al.

(10) Patent No.: US 9,331,710 B1
(45) Date of Patent: May 3, 2016

(54) METHOD AND APPARATUS FOR ENCODING DIGITAL DATA INTO AN OVERSAMPLING DIGITAL TO ANALOG CONVERTER

(71) Applicant: NUVOTON TECHNOLOGY CORPORATION, Hsinchu (TW)

(72) Inventors: Peter Holzmann, San Jose, CA (US); Yao-Ching Liu, Cupertino, CA (US)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 14/751,131

(22) Filed: Jun. 26, 2015

(51) Int. Cl.
  *H03M 1/06* (2006.01)
  *H03M 1/66* (2006.01)
  *H03M 1/68* (2006.01)
  *H03M 1/00* (2006.01)
  *H03M 1/74* (2006.01)
  *H03M 1/12* (2006.01)

(52) U.S. Cl.
  CPC .......... *H03M 1/661* (2013.01); *H03M 1/0668* (2013.01); *H03M 1/687* (2013.01); *H03M 1/00* (2013.01); *H03M 1/12* (2013.01); *H03M 1/747* (2013.01)

(58) Field of Classification Search
  CPC .......... H03M 1/00; H03M 1/747; H03M 1/12
  USPC .................. 341/118, 144, 145, 150, 120, 136
  See application file for complete search history.

(56) References Cited

U.S. PATENT DOCUMENTS 7,199,740 B1 * 4/2007 Ferguson, Jr. ......... H03M 1/806
  341/144

* cited by examiner

*Primary Examiner* — Joseph J Lauture
(74) *Attorney, Agent, or Firm* — Kilpatrick Townsend & Stockton LLP (57) ABSTRACT

A method for an oversampling digital-to-analog converter (DAC) includes oversampling M-bit binary data to provide N-bit oversampled binary data, wherein M and N are integers and N is greater than M, encoding the N-bit oversampled binary data to provide $2^{(N-1)}$-bit thermometer code data and a sign bit, shuffling the $2^{(N-1)}$-bit thermometer code data to provide $2^{(N-1)}$-bit shuffled data, converting the $2^{(N-1)}$-bit shuffled data and the sign bit to an analog output signal, and smoothing the analog signal to provide a smoothed analog output signal.

18 Claims, 6 Drawing Sheets

METHOD AND APPARATUS FOR ENCODING DIGITAL DATA INTO AN OVERSAMPLING DIGITAL TO ANALOG CONVERTER

CROSS-REFERENCES TO RELATED APPLICATIONS

This application is related to, and incorporate by reference, the content of the following patents: U.S. Pat. No. 5,404,142, filed Aug. 5, 1993, entitled "Data-directed scrambler for multi-bit noise shaping D/A converters" to Adams et. al., and U.S. Pat. No. 7,079,063, filed Apr. 18, 2005, entitled "System and method for tri-level logic data shuffling for oversampling data conversion" to Nguyen et. al., U.S. Pat. No. 4,467,316, entitled "Generalized Interpolative Method for Digital/analog Conversion of PCM Signals," issued Aug. 21, 1984, to Musmann, et. al., U.S. Pat. No. 7,079,063, entitled "System and Method for Tri-level Logic Data Shuffling for Oversampling Data Conversion," issued Jul. 18, 2006, to Nguyen et. al., and U.S. Patent Application No. 2003/0103560, entitled "Digital interpolation filter and method of operating the digital interpolation filter," published Jun. 5, 2003, to Buch et. al.

BACKGROUND OF THE INVENTION

Embodiments of this invention generally relate to integrated circuits for signal processing. More particularly, embodiments of the invention relate to the field of Digital-to-Analog Converter (DAC) for Audio signals and provide methods and systems for oversampling DACs.

In current-steering DACs, switches are used to route current into sensing elements that can measure the amount of current flowing. The switches are driven by the digital value representing the number to be converted to analog, and the amount of current sensed becomes the analog value. As the number of bits and precision requirement increase, the number of components can also increase exponentially. In noise-shaping D/A converters, it is often necessary to remove large amounts of out-of-band noise produced by the digital modulator. An approach is to use a multi-bit noise-shaper, where the quantizer truncates the digital word to more than 1 bit. However, errors in the digital-to-analog converter used to turn the multi-bit digital signal into an analog voltage will cause linearity errors in the analog output. Proposals have been made of ways to use "scrambling" techniques to minimize the linearity problem with multi-bit noise-shapers. The "scrambling" arrangements often require that the multi-bit output of the noise shaper first be converted to a "thermometer code" in which all of the bits are equally weighted. In some thermometer encoders, an N-bit digital data is represented by $K=2^N$ bits of 0's and 1's. For example, a 5-bit binary code converted to a thermometer code would require 31 equally-weighted bits (the "all bits off" state does not require an output bit). If the input number was "11", then the thermometer code would have the bottom 11 bits set to a "1" and the top 20 bits set to "0".

BRIEF SUMMARY OF THE INVENTION

Even though the thermometer code is extensively used in DAC design, it requires a large number of bits. As described above, an N-bit digital data is represented by $K=2^N$ binary bits. A DAC integrated circuit includes many signal processing circuit blocks, and the chip area of the DAC can grow exponentially as the number of bits, and the corresponding number of signal processing elements also increases. The complexity is further compounded when oversampling techniques are used in the circuit, further increasing the number of bits and circuit components. Embodiments of the invention provide improved methods and apparatus for encoding digital data into an oversampling digital to analog converter, in which an N-bit digital data can be represented by $K=2^{(N-1)}$ binary bits and a sign bit, instead of the $2^N$ binary bits as in conventional DACs. As a result, data bit counts and the corresponding processing component counts are substantially reduced. Integrated circuit die size and cost can be lowered, circuit complexity is reduced, and performance can be improved. In some embodiments, oversampling DACs are provided that include a number of selectable single elements, for which a digital dynamic element matching pattern is applied to reduce the audible impact of element mismatch.

According to some embodiments, a method for an oversampling digital-to-analog converter (DAC) includes oversampling M-bit binary data to provide N-bit oversampled binary data, wherein M and N are integers and N is greater than M, encoding the N-bit oversampled binary data to provide $2^{(N-1)}$-bit thermometer code data and a sign bit, shuffling the $2^{(N-1)}$-bit thermometer code data to provide $2^{(N-1)}$-bit shuffled data, converting the $2^{(N-1)}$-bit shuffled data and the sign bit to an analog output signal, and smoothing the analog signal to provide a smoothed analog output signal.

In some embodiments of the above method, encoding the N-bit oversampled binary data includes encoding the least significant N−1 bits of the N-bit oversampled data into $2^{(N-1)}$-bit thermometer code data, and treating the most significant bit of the N-bit oversampled data as the sign bit. In some embodiments, shuffling the $2^{(N-1)}$-bit thermometer code data comprises shaping mismatch errors into an out-of-band frequency region.

According to some embodiments, a system for an oversampling digital-to-analog converter (DAC) includes a digital interpolation filter for receiving M-bit binary data and for providing N-bit oversampled binary data, wherein M and N are integers and N is greater than M. The system also includes a thermometer encoder coupled to the digital interpolation filter for receiving the N-bit oversampled binary data and for providing $2^{(N-1)}$-bit thermometer code data and a sign bit. The system further includes a random data shuffler coupled to the thermometer encoder for receiving the $2^{(N-1)}$-bit thermometer code data and the sign bit and for providing $2^{(N-1)}$-bit shuffled data and the sign bit, a digital-to-analog converter (DAC) including a plurality of digital-to-analog converting elements coupled to the random data shuffler for receiving the $2^{(N-1)}$-bit shuffled data and the sign bit and for providing an analog output signal, and a smoothing filter coupled to the DAC for receiving the analog output signal and for providing a smoothed analog output signal.

In some embodiments of the above system, the digital interpolation filter includes a low-pass filter. In some embodiments, the thermometer encoder is configured to encode the least significant N−1 bits of the N-bit oversampled data into $2^{(N-1)}$-bit thermometer code data and to treat the most significant bit of the N-bit oversampled data as the sign bit. In some embodiments, the random data shuffler is configured to shape mismatch errors into an out-of-band frequency region. In some embodiments, the digital-to-analog converter (DAC) includes $2^{(N-1)}$ DAC elements. In some embodiments, the DAC further includes a plurality of level shifters. In some embodiments, the DAC is configured to activate $2^N$ digital-to-analog converting elements. In some embodiments, the DAC is configured to activate $2^{(N-1)}$ digital-to-analog converting elements, and the DAC also includes a signal conversion circuit in response to the sign bit. In some embodiments, the smoothing filter comprises a plurality of low-pass filters.

According to some embodiments, a method for an oversampling digital-to-analog converter (DAC) is provided. The method can be briefly summarized as follows.

Receive M-bit binary data at a digital interpolation filter;
Provide N-bit oversampled binary data, wherein M and N are integers and N is greater than M;
Receive the N-bit oversampled binary data at a thermometer encoder;
Provide $2^{(N-1)}$-bit thermometer code data and a sign bit;
Receive the $2^{(N-1)}$-bit thermometer code data and the sign bit at a random data shuffler;
Provide $2^{(N-1)}$-bit shuffled data and the sign bit;
Receive the $2^{(N-1)}$-bit shuffled data and the sign bit at a digital-to-analog converter (DAC);
Provide an analog output signal; and
Receive the analog output signal at a smoothing filter and provide a smoothed analog output signal.

In some embodiments of the above method, the digital interpolation filter includes a low-pass filter. In some embodiments, the thermometer encoder is configured to encode the least significant N−1 bits of the N-bit oversampled data into $2^{(N-1)}$-bit thermometer code data and to treat the most significant bit of the N-bit oversampled data as the sign bit. In some embodiments, the random data shuffler is configured to shape mismatch errors into an out-of-band frequency region. In some embodiments, the digital-to-analog converter (DAC) includes $2^{(N-1)}$ DAC elements. In some embodiments, the DAC further comprises a plurality of level shifters. In some embodiments, the DAC is configured to activate $2^N$ digital-to-analog converting elements. In some embodiments, the DAC is configured to activate $2^{(N-1)}$ digital-to-analog converting elements, and the DAC also includes a signal conversion circuit in response to the sign bit. In some embodiments, the smoothing filter includes a plurality of low-pass filters.

A further understanding of the nature and advantages of the present invention may be realized by reference to the remaining portions of the specification and the drawings.

DETAILED DESCRIPTION OF THE INVENTION

Figure 1:
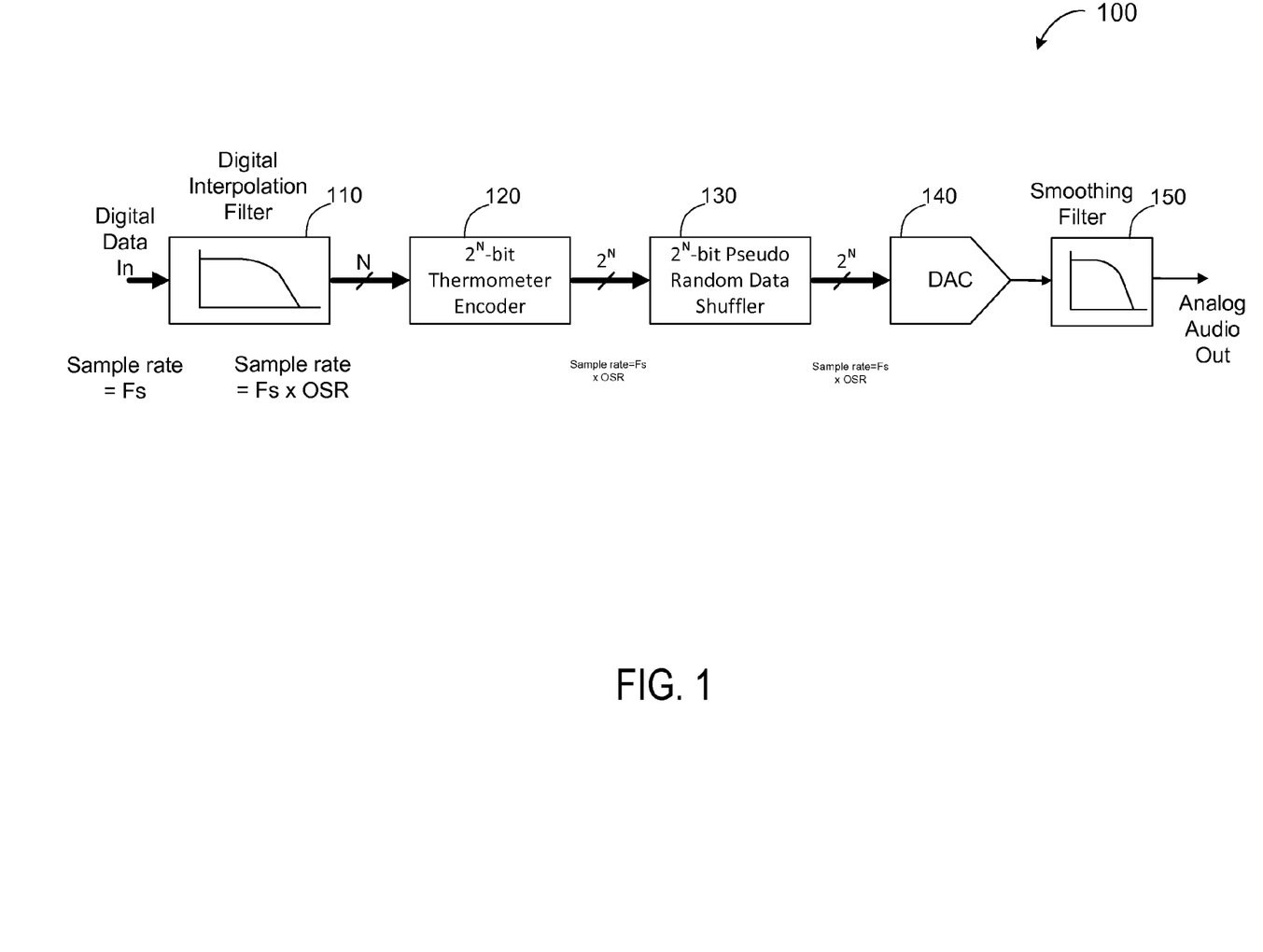
FIG. 1 is a simplified block diagram illustrating an Analog Converter (DAC) system according to an embodiment of the present invention.

FIG. 1 is a simplified block diagram illustrating a Digital-to-Analog Converter (DAC) system 100 according to an embodiment of the present invention. In digital signal processing, theoretically a bandwidth-limited signal can be reconstructed if sampled above the Nyquist rate, which is twice the highest frequency in the signal. Oversampling is the process of sampling a signal with a sampling frequency higher than the Nyquist rate. It is known that oversampling can improve resolution, reduce noise, and help avoid aliasing and phase distortion by relaxing anti-aliasing filter performance requirements. A signal is said to be oversampled by a factor of k if it is sampled at k times the Nyquist rate. Here, k is also known as the oversampling ratio (OSR). As shown in FIG. 1, the digital data, e.g., audio data, enters a digital interpolation filter 110 at a sample rate of Fs. The interpolation filter 110 filters and up-samples the data at a sample rate of Fs×OSR and generates N bits of data. These N bits of data are then converted to $2^N$-bits of thermometer code at a thermometer encoder 120. A pseudo random data shuffler 130 then applies data shuffle to the thermometer code in order to mitigate the effects of mismatch of the elements in a DAC (digital-to-analog converter) 140. The discrete DAC output samples are filtered by a smoothing filter 150 in order to eliminate the out-of-band noise at Fs×OSR. This analog smoothing filter typically consumes significant integrated circuit die area due to large capacitors. In order to reduce the area of the smoothing filter, the step size of the discrete DAC samples can be reduced by increasing the number of bits N. However, this will increase the size of the DAC, the thermometer encoder, and the pseudo random data shuffler. In addition, the interface between the DAC and pseudo random shuffler typically crosses a power domain boundary between digital and analog power. Therefore, level shifters and significant routing are typically present at this interface, and their size and complexity also increase with the number of bits.

In embodiments of the present invention described below, improved methods and apparatus are provided for encoding digital data into an oversampling digital to analog converter. Techniques are presented to reduce the complexity of the thermometer encoder, the pseudo random data shuffler and the interface to the DAC in order to increase the number of bits N with reduced area impact.

Figure 2:
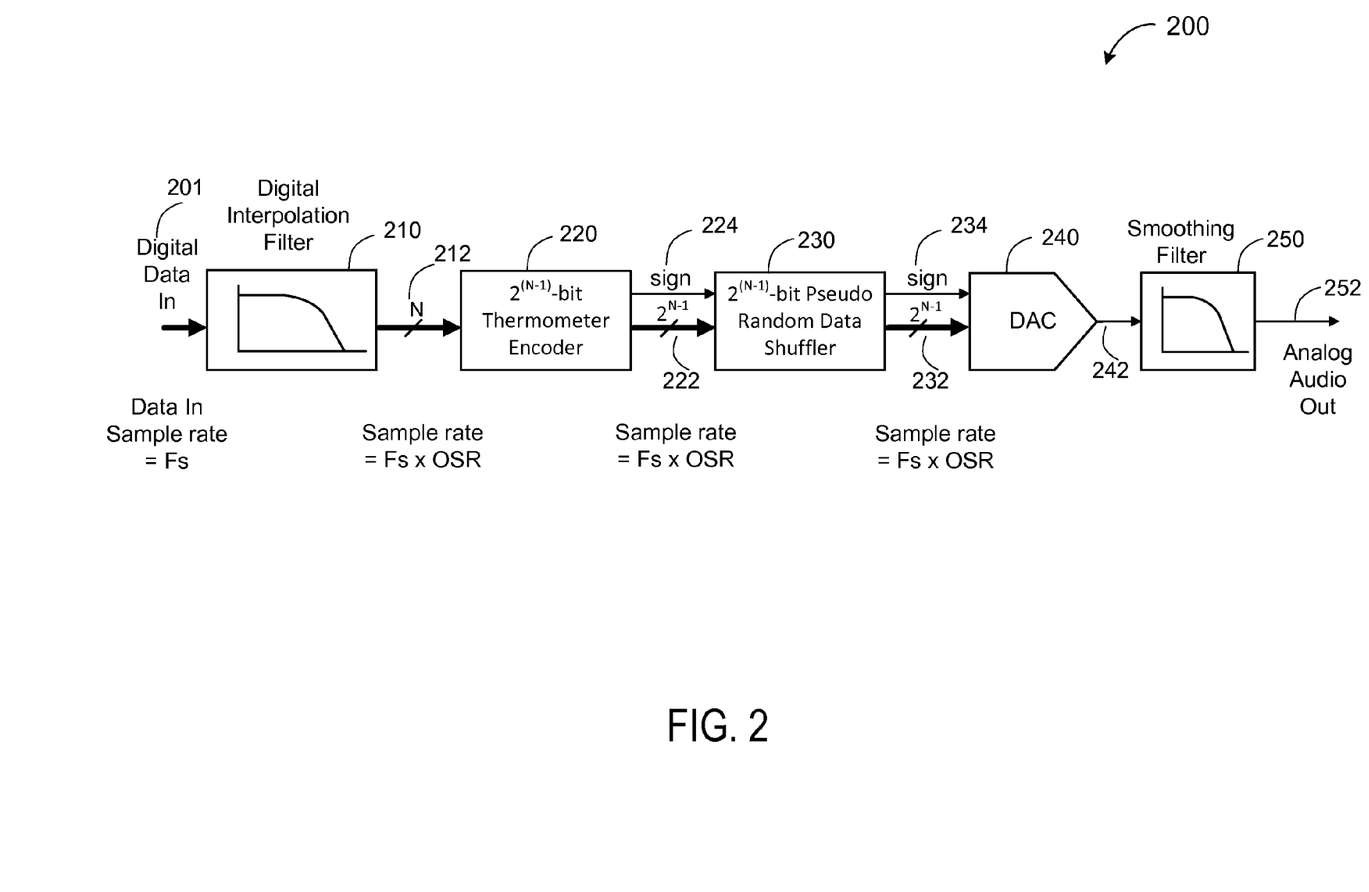
FIG. 2 is a simplified block diagram illustrating an Analog Converter (DAC) system according to another embodiment of the present invention.

FIG. 2 is a simplified block diagram illustrating a Digital to Analog Converter (DAC) system 200 according to another embodiment of the present invention. In the embodiment shown in FIG. 2, system 200 is a system for encoding digital data into an oversampling digital-to-analog converter (DAC). In current-steering DACs, switches are used to route current into sensing elements that can measure the amount of current flowing. The switches are driven by the digital value representing the number to be converted to analog, and the amount of current sensed becomes the analog value. However, if, when changing digital values, some switches open and others close, a glitch can be created at the output. To reduce the switching mismatch and glitches, thermometer code is often used. However, the thermometer code requires a large number of bits for data representation. In some embodiments, a thermometer-coded DAC has an equal resistor or current-source segment for each possible value of DAC output. The thermometer-coded DAC is a fast and high precision DAC architecture, but the performance is realized with a high cost. For example, an 8-bit thermometer DAC would have 256 segments, and a 16-bit thermometer DAC would have 65,536 segments.

Embodiments of the present invention provide an oversampling digital-to-analog converter (DAC) with reduced component counts and lower cost. In an embodiment, as shown in FIG. 2, the digital audio data 201, e.g., with M bits of binary data, enters the system at a digital interpolation filter 210 at a sample rate of Fs. Interpolation filter 210 filters and up-samples the data to Fs×OSR and generates N bits of binary data. Here, M and N are integers, and N is greater than M. In this embodiment, these N bits of data are then converted into $2^{(N-1)}$ bits of thermometer code 222 and a sign bit 224 at a thermometer encoder 220. A pseudo random data shuffler 230 then applies data shuffle to the thermometer code and provides $2^{(N-1)}$ bits of data 232 and a sign bit 234 to a DAC (digital-to-analog converter) 240. The data shuffle helps to mitigate the effects of mismatch of the DAC (digital-to-analog converter) 240. The discrete DAC output samples 242 are filtered by a smoothing filter 250 to provide analog audio output data 252, in order to eliminate the out-of-band noise at Fs×OSR.

In system 200, digital interpolation filter 210 is configured for receiving M-bit binary data 201 and for providing N-bit oversampled binary data 212. As used in this description, M and N are integers and N is greater than M. Oversampling using a digital interpolation filter can be implemented using known digital signal processing techniques. Depending on the embodiments, the digital interpolation filter can be implemented using logic circuit elements, software techniques, or a combination of both. In an embodiment, interpolation by an integer factor, L, the oversampling ratio (OSR), can be explained as a 2-step process, creating a sequence, x_L[n], including the original samples, x[n], separated by L−1 zeros, and smoothing out the discontinuities with a low-pass filter, which replaces the zeros. In this application, the filter is called an interpolation filter. In an example, let X(f) be the Fourier transform of any function, x(t), whose samples at some interval, T, equal the x[n] sequence. Then the discrete-time Fourier transform (DTFT) of the x[n] sequence is the Fourier series representation of a periodic summation of X(f):

$$\underbrace{\sum_{n=\infty}^{\infty}\frac{x[n]}{x(nT)}e^{-i2\pi fnT}}_{DTFT} = \frac{1}{T}\sum_{k=\infty}^{\infty}X(f-k/T).$$

where T has units of seconds, and f has units of hertz. Sampling L times faster (at interval T/L) increases the periodicity by a factor of L:

$$\underbrace{\sum_{n=\infty}^{\infty}\frac{x[n]}{x(nT)}e^{-i2\pi fnT}}_{DTFT} = \frac{1}{T}\sum_{k=\infty}^{\infty}X(f-k/T).$$

which is also the desired result of interpolation.

In other embodiments, alternative digital interpolation filters can be used. For example, examples of digital interpolation filters are described in U.S. Pat. No. 4,467,316, entitled "Generalized Interpolative Method for Digital/analog Conversion of PCM Signals," issued Aug. 21, 1984, to Musmann, et. al., U.S. Pat. No. 7,079,063, entitled "System and Method for Tri-level Logic Data Shuffling for Oversampling Data Conversion," issued Jul. 18, 2006, to Nguyen, et. al., and US Patent Application No. 2003/0103560, entitled "Digital interpolation filter and method of operating the digital interpolation filter," published Jun. 5, 2003, to Buch, et. al. The contents of all the above references are incorporated by reference herein.

As described above, system 200 also includes a thermometer encoder 220 coupled to digital interpolation filter 210 for receiving the N-bit oversampled binary data 212 and for providing $2^{(N-1)}$-bit thermometer code data 222 and a sign bit 224. In an embodiment, the thermometer encoder is configured to encode the least significant N−1 bits of the N-bit oversampled data into $2^{(N-1)}$-bit thermometer code data and to treat the most significant bit of the N-bit oversampled data as the sign bit. Depending on the embodiments, the thermometer encoder can be implemented using logic circuit elements, software techniques, or a combination of both.

Figure 3A:
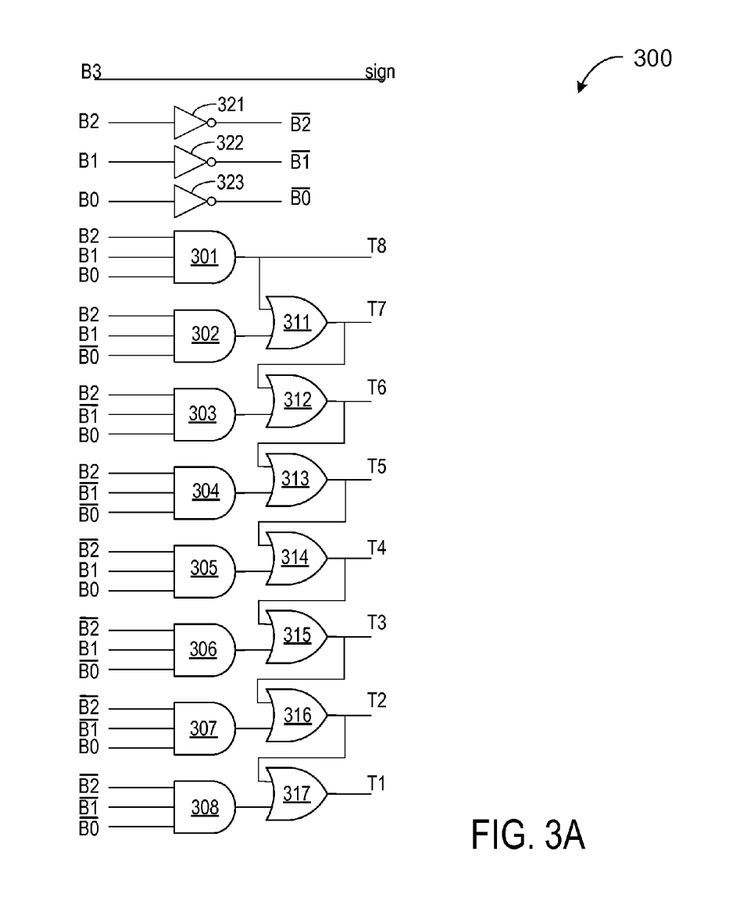
FIG. 3A is a simplified block diagram illustrating a thermometer encoder according to an embodiment of the present invention.

FIG. 3A is a simplified block diagram illustrating an thermometer encoder according to an embodiment of the present invention. In this example, N=4, and the 4-bit binary number, B3, B2, B1, and B0, can be treated as including a sign bit B3 and three data bits, B2, B1, and B0. In this case, the sign bit is the most significant bit B3. The three data bits B2, B1, and B0 are converted into an 8-bit thermometer code represented by bits T8, T7, T6, T5, T4, T3, T2, and T1, in which each of the thermometer code bits is either a "0" or a "1". As shown in FIG. 3, thermometer encoder 300 includes eight AND gates 301-308 and seven OR gates 311-317. In addition, thermometer encoder 300 also includes three inverters 321-323 for providing the inverse values of data bits B2, B1, and B0. Of course, thermometer encoder 300 illustrated in FIG. 3A is only an example, and other thermometer encoders can be used depending on the embodiments.

Table 1 shows the 8-bit thermometer code T8-T1 for each of the value of 3-bit binary input data B2-B0 for thermometer encoder 300 illustrated in FIG. 3.

TABLE 1

| B2 | B1 | B0 | T8 | T7 | T6 | T5 | T4 | T3 | T2 | T1 |
|----|----|----|----|----|----|----|----|----|----|----|
| 0 | 0 | 0 | 0 | 0 | 0 | 0 | 0 | 0 | 0 | 1 |
| 0 | 0 | 1 | 0 | 0 | 0 | 0 | 0 | 0 | 1 | 1 |
| 0 | 1 | 0 | 0 | 0 | 0 | 0 | 0 | 1 | 1 | 1 |
| 0 | 1 | 1 | 0 | 0 | 0 | 0 | 1 | 1 | 1 | 1 |
| 1 | 0 | 0 | 0 | 0 | 0 | 1 | 1 | 1 | 1 | 1 |
| 1 | 0 | 1 | 0 | 0 | 1 | 1 | 1 | 1 | 1 | 1 |
| 1 | 1 | 0 | 0 | 1 | 1 | 1 | 1 | 1 | 1 | 1 |
| 1 | 1 | 1 | 1 | 1 | 1 | 1 | 1 | 1 | 1 | 1 |

Figure 3B:
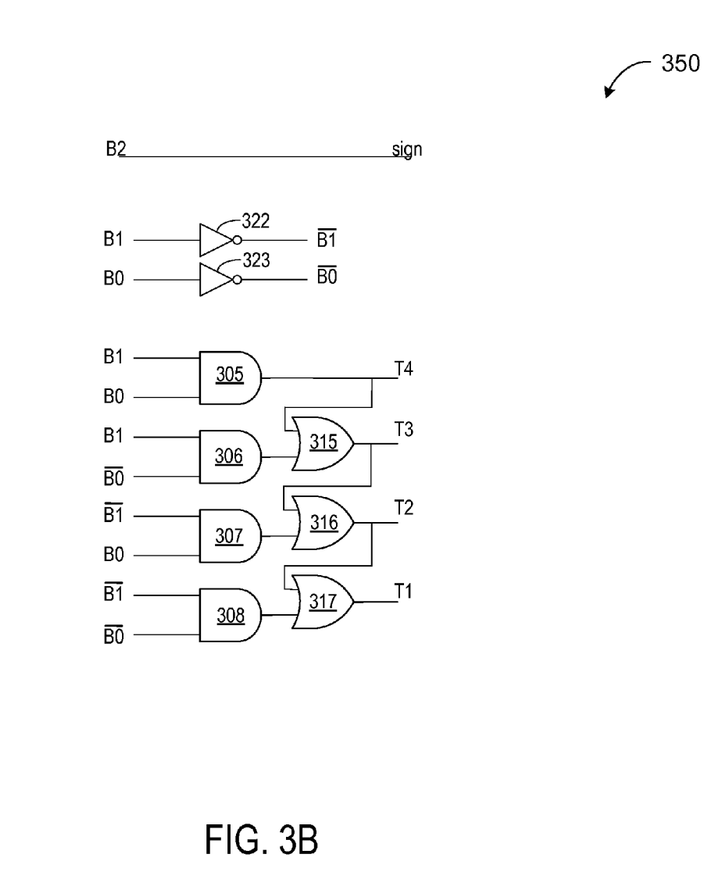
FIG. 3B is a simplified block diagram illustrating an thermometer encoder according to another embodiment of the present invention.

FIG. 3B is a simplified block diagram illustrating an thermometer encoder according to another embodiment of the present invention. In thermometer encoder 350, N=3, and the 3-bit binary number, B2, B1, and B0, can be treated as including a sign bit B2 and two data bits, B1, and B0. In this case, the sign bit is the most significant bit B2. The two data bits B1, and B0 are converted into a 4-bit thermometer code represented by bits T4, T3, T2, and T1, in which each of the thermometer code bits is either a "0" or a "1". As shown in FIG. 3B, thermometer encoder 350 includes four AND gates 305-308 and three OR gates 315-317. In addition, thermometer encoder 350 also includes two inverters 322-323 for providing the inverse values of data bits B1 and B0. The operations of thermometer encoder 350 is similar to those of thermometer encoder 300 depicted in FIG. 3A.

System 200 also includes a random data shuffler 230 coupled to the thermometer encoder for receiving the $2^{N-1}$-bit thermometer code data 222 and the sign bit 224 and for providing $2^{N-1}$-bit shuffled data 232 and the sign bit 234. In some embodiments, the function of the shuffler is to shape the mismatch error into an out-of-band frequency region. The data shuffler can be implemented using known techniques.

System 200 further includes a digital-to-analog converter (DAC) 240 including a plurality of digital-to-analog converting elements coupled to the random data shuffler 230 for receiving the $2^{(N-1)}$-bit shuffled data 232 and the sign bit 234 and for providing an analog output signal 242. The DAC elements can be switched current sources, switched capacitors, or switched resistors. The DAC can be implemented using known circuit techniques. In an embodiment, the DAC is configured to activate $2^{(N-1)}$ digital-to-analog converting elements, and the DAC also includes a signal conversion circuit in response to the sign bit.

Moreover, system 200 also includes a smoothing filter 250 coupled to the DAC for receiving the analog output signal 242 and for providing a smoothed analog output signal 252. In some embodiments, discrete DAC output samples are filtered by the smoothing filter in order to eliminate the out-of-band noise at Fs×OSR. This analog smoothing filter typically consumes significant die area due to large capacitors. Embodiments of the invention can reduce component counts and substantially reduce the die area of the device. The smoothing filter can be implemented using known circuit techniques. In an embodiment, the smoothing filter includes a plurality of low-pass filters.

Examples of data shufflers, DACs, and smoothing filters are disclosed, for example, in U.S. Pat. No. 5,404,142, filed Aug. 5, 1993, entitled "Data-directeds for Multi-bit Noise Shaping D/A converters," to Adams, et. al, and U.S. Pat. No. 7,079,063, filed Apr. 18, 2005, entitled "System and Method for Tri-level Logic Data Shuffling for Oversampling Data Conversion" to Nguyen, et. al. Both of these are incorporated by reference herein in their entirety.

In order to reduce the area of the smoothing filter, the step size of the discrete DAC samples can be reduced by increasing the number of bits N. However, this will increase the DAC, the thermometer encoder, and the pseudo random data shuffler. In addition, the interface between the DAC and pseudo random shuffler typically crosses a power domain boundary between digital and analog power. Therefore, level shifters and significant routing are typically present at this interface.

It can be seen in FIG. 2 that the $2^N$-bit thermometer encoder is now replaced with a $2^{(N-1)}$-bit encoder and a sign bit. This reduces the total number of bits required by a factor of 2, but adds a sign bit. For example, if N=5, then 64 thermometer bits will become 32 with a sign bit equals 33. The pseudo random data shuffler can also be reduced to $2^{(N-1)}$-bits, while the intrinsic delay of this operation is also applied to the sign bit to maintain its phase with the data. The interface to the DAC is now reduced to $1+2^{(N-1)}$ signals and level shifters. Inside the DAC, the data can either be converted to activate either $2^N$ elements or $2^{(N-1)}$ elements with a signal inversion by using the sign bit.

Figure 4:
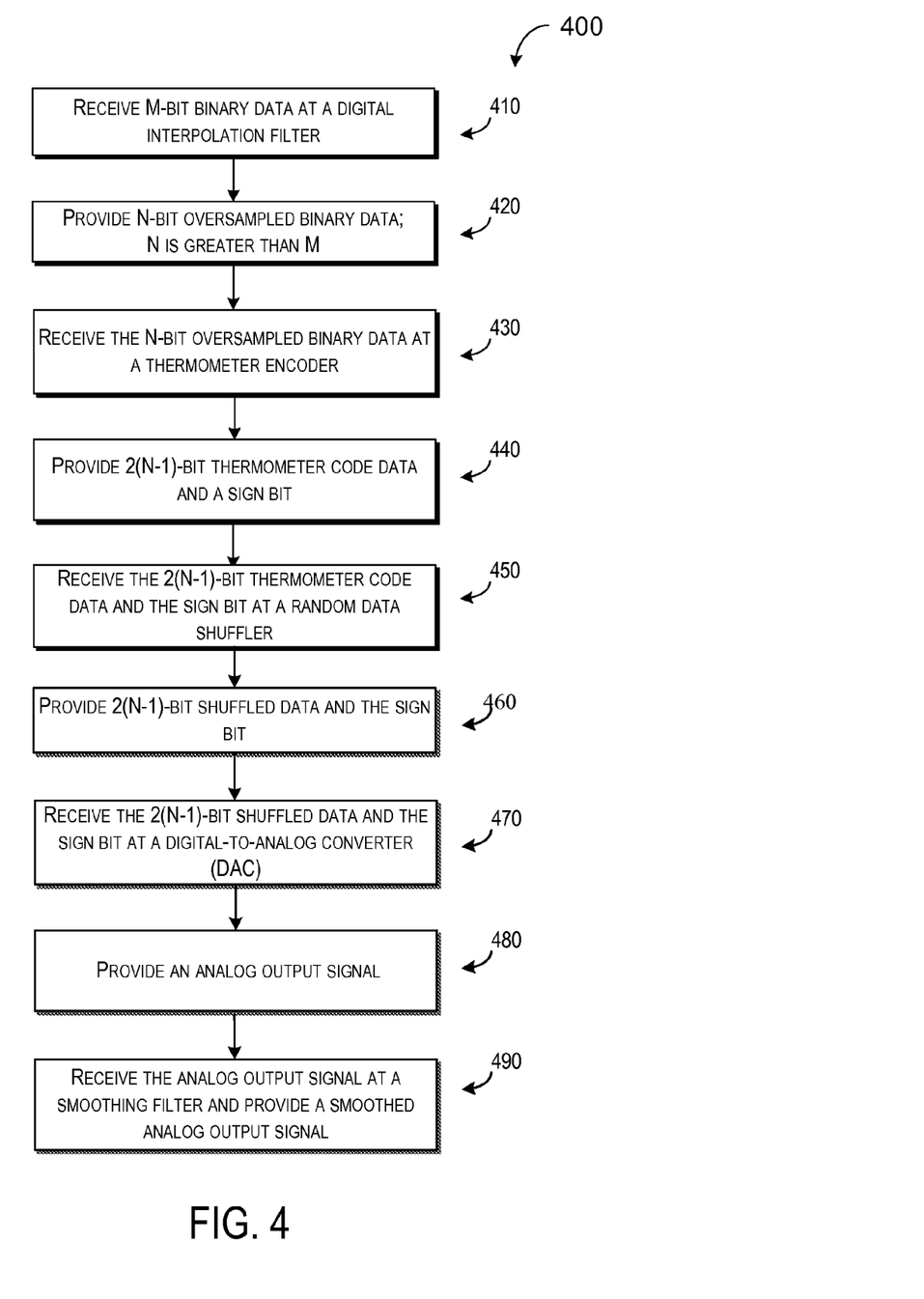
FIG. 4 is a flowchart illustrating a method for processing digital data in a digital-to-analog converter (DAC) according to another embodiment of the present invention.

FIG. 4 is a flowchart illustrating a method for processing digital data in a digital-to-analog converter (DAC) according to another embodiment of the present invention. As shown in FIG. 4, the flowchart illustrates a method 400 for encoding digital data into an oversampling digital-to-analog converter (DAC). The method can be briefly summarized as follows.

Step 410: Receive M-bit binary data at a digital interpolation filter;
Step 420: Provide N-bit oversampled binary data, wherein M and N are integers and N is greater than M;
Step 430: Receive the N-bit oversampled binary data at a thermometer encoder;
Step 440: Provide $2^{(N-1)}$-bit thermometer code data and a sign bit;
Step 450: Receive the $2^{(N-1)}$-bit thermometer code data and the sign bit at a random data shuffler;
Step 460: Provide $2^{(N-1)}$-bit shuffled data and the sign bit;
Step 470: Receive the $2^{(N-1)}$-bit shuffled data and the sign bit at a digital-to-analog converter (DAC);
Step 480: Provide an analog output signal; and
Step 490: Receive the analog output signal at a smoothing filter and provide a smoothed analog output signal.

As shown above, method 400 can be carried out using system 200 illustrated in FIGS. 2-3 and described in the accompanying text. With reference to FIGS. 2-3, method 400 can be described as follows. At step 410, an M-bit binary data is received at a digital interpolation filter 210. At step 420, digital interpolation filter 210 provides N-bit oversampled binary data 212, wherein M and N are integers and N is greater than M. At step 430, the N-bit oversampled binary data is received at a thermometer encoder 220. At step 440, thermometer encoder 220 provides $2^{(N-1)}$-bit thermometer code data 222 and a sign bit 224. At step 450, the $2^{(N-1)}$-bit thermometer code data 222 and the sign bit 224 are received at a random data shuffler 230. At step 460, random data shuffler 230 provides $2^{(N-1)}$-bit shuffled data 232 and the sign bit 234. At step 470, the $2^{(N-1)}$-bit shuffled data and the sign bit are received at a digital-to-analog converter (DAC) 240. At step 480, DAC 240 provides an analog output signal 242. At step 490, a smoothing filter 250 receives analog output signal 242 and provides a smoothed analog output signal 252.

In some embodiments of method 400, the digital interpolation filter includes a low-pass filter. In some embodiments, the thermometer encoder is configured to encode the least significant N−1 bits of the N-bit oversampled data into $2^{(N-1)}$-bit thermometer code data and to treat the most significant bit of the N-bit oversampled data as the sign bit. In some embodiments, the random data shuffler is configured to shape mismatch errors into an out-of-band frequency region. In some embodiments, the digital-to-analog converter (DAC) comprises $2^{(N-1)}$ DAC elements. In some embodiments, the DAC further comprises a plurality of level shifters. In some embodiments, the DAC is configured to activate $2^N$ digital-to-analog converting elements. In some embodiments, the DAC is configured to activate $2^{(N-1)}$ digital-to-analog converting elements, wherein the DAC includes a signal conversion circuit in response to the sign bit. In some embodiments, the smoothing filter includes a plurality of low-pass filters.

Figure 5:
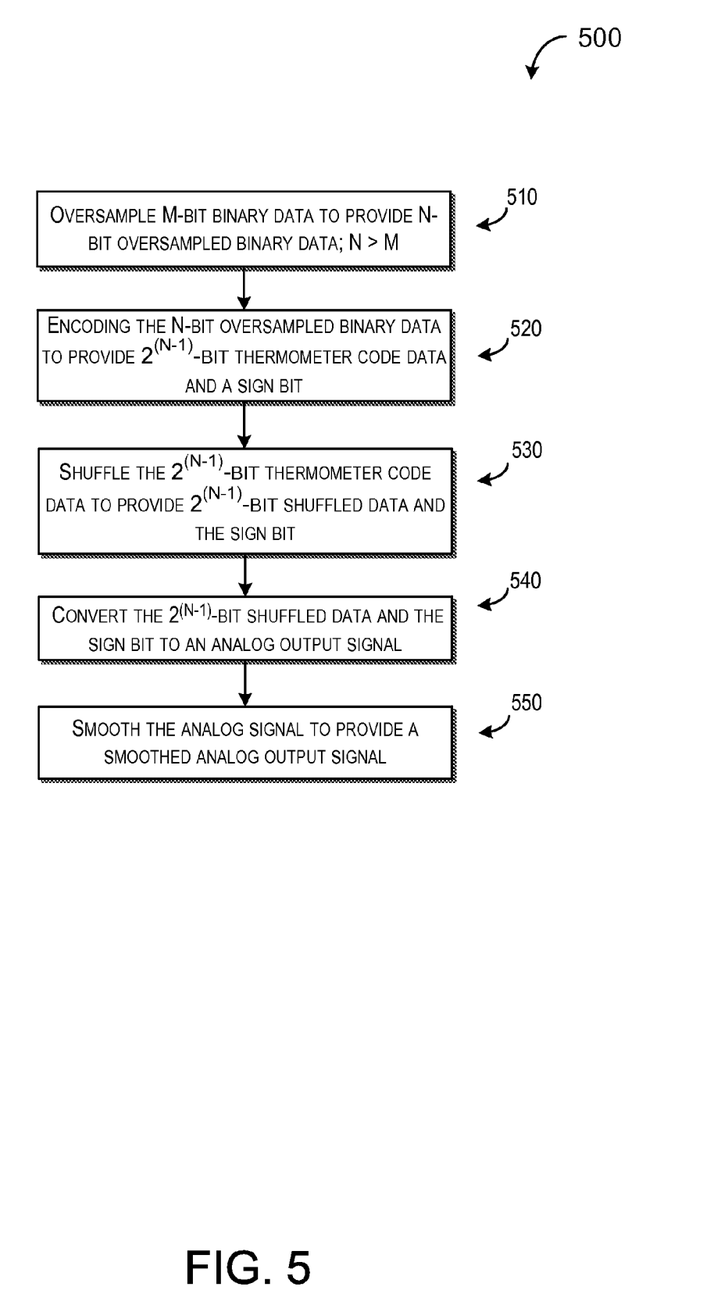
FIG. 5 is a flowchart illustrating a method for processing digital data in a digital-to-analog converter (DAC) according to yet another embodiment of the present invention.

FIG. 5 is a flowchart illustrating a method for processing digital data in a digital-to-analog converter (DAC) according to another embodiment of the present invention. The method for encoding digital data into an oversampling digital-to-analog converter (DAC) can be summarized as follows.

Step 510: Oversample M-bit binary data to provide N-bit oversampled binary data, wherein M and N are integers and N is greater than M;
Step 520: Encode the N-bit oversampled binary data to provide $2^{(N-1)}$-bit thermometer code data and a sign bit;
Step 530: Shuffle the $2^{(N-1)}$-bit thermometer code data to provide $2^{(N-1)}$-bit shuffled data and the sign bit;
Step 540: Convert the $2^{(N-1)}$-bit shuffled data and the sign bit to an analog output signal; and
Step 550: Smooth the analog signal to provide a smoothed analog output signal.

Some of the details of method 500 are similar to those described above regarding method 400, but without reliance on specific hardware elements for implementation. In some embodiments, encoding the N-bit oversampled binary data includes encoding the least significant N−1 bits of the N-bit oversampled data into $2^{(N-1)}$-bit thermometer code data, and treating the most significant bit of the N-bit oversampled data as the sign bit. In some embodiments, shuffling the $2^{(N-1)}$-bit thermometer code data comprises shaping mismatch errors into an out-of-band frequency region.

Although embodiments of the invention have been disclosed herein in detail, it is to be understood that it is for the purpose of illustrating the invention, and should not be construed as necessarily limiting. Those skilled in the art will appreciate that numerous variations and modifications may be made to the above-disclosed embodiments without departing from the spirit and scope of the invention.

What is claimed is:

1. A system for an oversampling digital-to-analog converter (DAC), the system comprising:
   a digital interpolation filter for receiving M-bit binary data and for providing N-bit oversampled binary data, wherein M and N are integers and N is greater than M;
   a thermometer encoder coupled to the digital interpolation filter for receiving the N-bit oversampled binary data and for providing $2^{(N-1)}$-bit thermometer code data and a sign bit;
   a random data shuffler coupled to the thermometer encoder for receiving the $2^{(N-1)}$-bit thermometer code data and the sign bit and for providing $2^{(N-1)}$-bit shuffled data and the sign bit;
   a digital-to-analog converter (DAC) including a plurality of digital-to-analog converting elements coupled to the random data shuffler for receiving the $2^{(N-1)}$-bit shuffled data and the sign bit and for providing an analog output signal; and
   a smoothing filter coupled to the DAC for receiving the analog output signal and for providing a smoothed analog output signal.

2. The system of claim 1, wherein the digital interpolation filter comprises a low-pass filter.

3. The system of claim 1, wherein the thermometer encoder is configured to encode the least significant N−1 bits of the N-bit oversampled data into $2^{(N-1)}$-bit thermometer code data and to treat the most significant bit of the N-bit oversampled data as the sign bit.

4. The system of claim 1, wherein the random data shuffler is configured to shape mismatch errors into an out-of-band frequency region.

5. The system of claim 1, wherein the digital-to-analog converter (DAC) comprises $2^{(N-1)}$ DAC elements.

6. The system of claim 5, wherein the DAC further comprises a plurality of level shifters.

7. The system of claim 5, wherein the DAC is configured to activate $2^N$ digital-to-analog converting elements.

8. The system of claim 5, wherein the DAC is configured to activate $2^{(N-1)}$ digital-to-analog converting elements, wherein the DAC includes a signal conversion circuit in response to the sign bit.

9. The system of claim 1, wherein the smoothing filter comprises a plurality of low-pass filters.

10. A method for an oversampling digital-to-analog converter (DAC), the method comprising:
    receiving M-bit binary data at a digital interpolation filter;
    providing N-bit oversampled binary data, wherein M and N are integers and N is greater than M;
    receiving the N-bit oversampled binary data at a thermometer encoder;
    providing $2^{(N-1)}$-bit thermometer code data and a sign bit;
    receiving the $2^{(N-1)}$-bit thermometer code data and the sign bit at a random data shuffler;
    providing $2^{(N-1)}$-bit shuffled data and the sign bit;
    receiving the $2^{(N-1)}$-bit shuffled data and the sign bit at a digital-to-analog converter (DAC);
    providing an analog output signal;
    receiving the analog output signal at a smoothing filter and providing a smoothed analog output signal.

11. The method of claim 10, wherein providing $2^{(N-1)}$-bit thermometer code data and a sign bit comprises:
    encoding the least significant N−1 bits of the N-bit oversampled data into $2^{(N-1)}$-bit thermometer code data; and
    treating the most significant bit of the N-bit oversampled data as the sign bit.

12. The method of claim 10, wherein providing $2^{(N-1)}$-bit shuffled data comprises shaping mismatch errors into an out-of-band frequency region.

13. The method of claim 10, wherein the digital-to-analog converter (DAC) comprises $2^{(N-1)}$ DAC elements.

14. The method of claim 10, wherein the DAC further comprises a plurality of level shifters.

15. The method of claim 10, wherein the DAC is configured to activate $2^{(N-1)}$ digital-to-analog converting elements, wherein the DAC includes a signal conversion circuit in response to the sign bit.

16. A method for an oversampling digital-to-analog converter (DAC), the method comprising:
    oversampling M-bit binary data to provide N-bit oversampled binary data, wherein M and N are integers and N is greater than M;
    encoding the N-bit oversampled binary data to provide $2^{(N-1)}$-bit thermometer code data and a sign bit;
    shuffling the $2^{(N-1)}$-bit thermometer code data to provide $2^{(N-1)}$-bit shuffled data;
    converting the $2^{(N-1)}$-bit shuffled data and the sign bit to an analog output signal;
    smoothing the analog signal to provide a smoothed analog output signal.

17. The method of claim 16, wherein encoding the N-bit oversampled binary data comprises:
    encoding the least significant N−1 bits of the N-bit oversampled data into $2^{(N-1)}$-bit thermometer code data; and
    treating the most significant bit of the N-bit oversampled data as the sign bit.

18. The method of claim 16, wherein shuffling the $2^{(N-1)}$-bit thermometer code data comprises shaping mismatch errors into an out-of-band frequency region.

* * * * *